(12) United States Patent
Rigney et al.

(10) Patent No.: US 6,342,278 B1
(45) Date of Patent: Jan. 29, 2002

(54) METHOD FOR FORMING A THERMAL BARRIER COATING BY ELECTRON BEAM PHYSICAL VAPOR DEPOSITION

(75) Inventors: Joseph D. Rigney, Milford; Antonio F. Maricocchi, Loveland; Brent R. Tholke, Sycamore Township, all of OH (US); Karl S. Fessenden, Wilder, KY (US); John D. Evans, Sr., Springfield, OH (US)

(73) Assignee: General Electric Company, Cincinnati, OH (US)

( * ) Notice: Subject to any disclaimer, the term of this patent is extended or adjusted under 35 U.S.C. 154(b) by 0 days.

(21) Appl. No.: 09/407,872

(22) Filed: Sep. 29, 1999

Related U.S. Application Data

(60) Provisional application No. 60/147,165, filed on Aug. 4, 1999.

(51) Int. Cl.[7] ............................. B05D 1/34; B05D 1/36; C23C 8/10; C23C 14/08; C23C 14/30
(52) U.S. Cl. ................. 427/567; 427/585; 427/255.31; 427/255.32
(58) Field of Search .................. 427/567, 585, 427/250, 255.31–255.32

(56) References Cited

U.S. PATENT DOCUMENTS

| | | | | |
|---|---|---|---|---|
| 4,006,268 A | | 2/1977 | Kennedy et al. | 427/566 |
| 4,676,994 A | * | 6/1987 | Demaray | 427/567 |
| 5,055,319 A | * | 10/1991 | Bunshah et al. | 427/567 |
| 5,618,575 A | * | 4/1997 | Peter | 427/567 |
| 5,645,893 A | | 7/1997 | Rickerby et al. | 427/405 |
| 5,652,044 A | * | 7/1997 | Rickerby | 427/567 |
| 5,716,720 A | | 2/1998 | Murphy | 428/623 |
| 5,792,521 A | * | 8/1998 | Wortman | 427/567 |
| 5,834,070 A | * | 11/1998 | Movchan et al. | 427/567 |
| 6,110,604 A | * | 8/2000 | Rickerby | 427/567 |

OTHER PUBLICATIONS

Kreutz, E.W., et al.—A Comparative Study of $ZrO_2$ Film Deposition by Electron and Laser Radiation—Jun. 14, 1993 (pp. 475–487) 5th International Conference on Welding & Melting by electron & laser beam in French & English.

Hass, D.D., et al.—Electron beam directed vapor deposition of thermal barrier coatings—Nov. 1998 (pp. 3396–3401) *J. Vac. Sci Technol.* A16(6).

* cited by examiner

*Primary Examiner*—Marianne Padgett
(74) *Attorney, Agent, or Firm*—Andrew C. Hess; David L. Narciso

(57) ABSTRACT

A method of depositing a ceramic thermal barrier coating on an article that will be subjected to a hostile environment, such as turbine, combustor and augmentor components of a gas turbine engine. The thermal barrier coating is deposited by electron beam physical vapor deposition (EBPVD) using process parameters that include an absolute pressure of greater than 0.010 mbar and an oxygen partial pressure of greater than 50%, preferably at or close to 100%. Under these conditions, the desired ceramic material is evaporated with an electron beam to produce a vapor that deposits on the component to form a thermal barrier coating of the ceramic material.

9 Claims, No Drawings

METHOD FOR FORMING A THERMAL BARRIER COATING BY ELECTRON BEAM PHYSICAL VAPOR DEPOSITION

This application claims benefit to U.S. provisional application Ser. No. 60/147,165, filed Aug. 4, 1999.

FIELD OF THE INVENTION

This invention relates to thermal barrier coatings for components exposed to high temperatures, such as the hostile thermal environment of a gas turbine engine. More particularly, this invention is directed to a method for forming thermal barrier coating having relatively low densities and low thermal conductivities.

BACKGROUND OF THE INVENTION

Thermal barrier coatings (TBC) have found wide use for thermally insulating the exterior surfaces of high-temperature gas turbine components in order to minimize the service temperatures of such components. Various ceramic materials have been employed as the TBC material, particularly zirconia ($ZrO_2$) stabilized by yttria ($Y_2O_3$), magnesia (MgO) or other oxides. These particular materials are preferred because they exhibit suitable thermal properties and can be readily deposited by plasma spray, flame spray and vapor deposition techniques. An example of the latter is electron beam physical vapor deposition (EBPVD), which produces a thermal barrier coating having a columnar grain structure that is able to expand with its underlying substrate during thermal cycling without causing damaging stresses. As a result, TBCs deposited by EBPVD generally exhibit enhanced strain tolerance, and are therefore relatively resistant to spalling.

To be effective, thermal barrier coatings must have low thermal conductivity, be capable of being strongly adhered to the article, and remain adherent through many heating and cooling cycles. The latter requirement is particularly demanding due to the different coefficients of thermal expansion between materials having low thermal conductivity and superalloy materials used to form turbine engine components. For this reason, thermal barrier coatings are typically deposited on a metallic bond coat formed on the surface of the component, yielding what is termed a thermal barrier coating system. The metallic bond coat is typically a diffusion aluminide or an oxidation-resistant overlay alloy coating, such as MCrAlX where M is iron, cobalt and/or nickel and X is hafnium, zirconium, yttrium, tantalum, platinum, palladium, silicon or a combination thereof. The bond coat promotes the adhesion of the insulating layer to the component while also inhibiting oxidation of the underlying superalloy.

The process of depositing TBC as well as other ceramic coatings by EBPVD generally entails initially loading the components to be coated into a coating chamber capable of operating at elevated temperatures (e.g., at least 900° C.) and subatmospheric pressures, typically about 0.005 mbar. For the purpose of maintaining stoichiometric proportions of the deposited ceramic, an oxygen partial pressure of up to 50% is maintained in the coating chamber by injecting oxygen and typically an inert gas into the chamber as either a mixture or separately through different inlets. The component is supported in proximity to an ingot of the ceramic coating material to be deposited, and an electron beam is projected onto the ingot so as to melt the surface of the ingot and produce a vapor of the ingot material that deposits onto the component, forming an adherent ceramic layer. The deposition process is continued until the desired thickness for the TBC is obtained. Yttria-stabilized zirconia (YSZ) having a thickness on the order of about 125 micrometers (about 0.005 inch) or more is relatively common in the art.

Though YSZ deposited by EBPVD is a highly successful coating system for protecting turbine engine components, there is an ongoing effort to improve the deposition process and thermal properties of such coatings, including reduced density and thermal conductivity.

SUMMARY OF THE INVENTION

The present invention is a method for producing a thermal barrier coating system on a component that will be subjected to a hostile thermal environment. Examples of such components include turbine, combustor and augmentor components of gas turbine engines. The thermal barrier coating system includes a ceramic thermal barrier coating (TBC), preferably yttria-stabilized zirconia (YSZ) having a columnar grain structure. According to the invention, the ceramic TBC is deposited by electron beam physical vapor deposition (EBPVD) using process parameters that significantly reduce the density and thermal conductivity of the TBC, and therefore improve its effectiveness.

The method of this invention generally entails depositing the ceramic TBC by EBPVD within a coating chamber held at an absolute pressure of greater than 0.010 mbar and with an oxygen partial pressure of greater than 50% of the absolute pressure. The desired partial pressure of oxygen can be obtained by flowing oxygen into the coating chamber at a rate that is greater than the combined flow rate of any other source gases into the coating chamber if an absolute pressure of above 0.010 mbar is maintained within the chamber. Under these conditions, the ceramic material is evaporated with an electron beam to produce a vapor of the ceramic material, which then deposits on a targeted component to form a spall-resistant layer of the ceramic material.

According to the invention, maintaining an oxygen partial pressure of greater than 50%, e.g., greater than 0.005 mbar when using an absolute coating pressure of 0.010 mbar, more preferably a partial pressure at or near 100%, has a significant effect on the density and thermal conductivity of the deposited ceramic coating. Specifically, the use of higher oxygen partial pressures has been shown to reduce both density and thermal conductivity of a ceramic coating deposited by EBPVD. As a result, thinner ceramic coatings can be deposited to obtain the same thermal insulating effect as thicker prior art coatings of the same ceramic material. Alternatively, greater temperature gradients can be achieved by depositing layers of the same thickness as prior art coatings. Another advantage observed with this invention is that higher coating deposition rates have been obtained as compared to prior art processes performed at conventional oxygen partial pressures, i.e., 50% and less, or oxygen flow rates less than that of other gases into the coating chamber. Accordingly, the method of the present invention not only improves the thermal properties of the resulting TBC, but also improves manufacturing economies.

Other objects and advantages of this invention will be better appreciated from the following detailed description.

DETAILED DESCRIPTION OF THE INVENTION

The present invention is generally directed to a method for depositing ceramic materials by EBPVD, and more particularly depositing ceramic thermal barrier coatings on components intended for operation within an environment characterized by high temperatures. Notable examples of such components include the high and low pressure turbine nozzles and blades, shrouds, combustor liners and augmentor hardware of gas turbine engines. While the advantages of this invention will be described with reference to superalloy turbine blades of gas turbine engines, the teachings of this invention are generally applicable to any metallic or ceramic substrate on which a thermal barrier coating would be beneficial to insulate the substrate from a hostile thermal environment.

Turbine blades are typically formed of nickel-base or cobalt-base superalloys, and have an airfoil section against which hot combustion gases are directed during operation of the gas turbine engine. For this reason, a thermal barrier coating system is adherently formed on the surface of the turbine blades to protect their superalloy substrate. As is generally typical in the art, coating systems within the scope of this invention are preferably composed of a metallic bond coat over which a ceramic coating is deposited. The bond coat is preferably an oxidation-resistant metal composition that protects the underlying superalloy substrate from oxidation and enables the ceramic coating to more tenaciously adhere to the substrate. Suitable bond coat materials include diffusion aluminide containing intermetallic platinum and/or nickel aluminide phases, and MCrAlX overlay coating alloys such as NiCrAlY. The thickness for a diffusion aluminide bond coat is at least about 25 micrometers, with a suitable range being about 50 to 75 micrometers. A typical thickness range for MCrAlY bond coats is about 25 to 375 micrometers.

Following deposition of the bond coat, the surface of the bond coat is prepared for deposition of the ceramic coating by abrasive grit blasting, which removes surface contaminants and yields a suitable surface roughness that promotes adhesion of the ceramic coating. Thereafter, an alumina scale is formed on the bond coat at an elevated temperature to further promote adhesion of the ceramic coating. The alumina scale, often referred to as a thermally grown oxide (TGO), develops from oxidation of the aluminum-containing bond coat either through exposure to elevated temperatures during deposition of the ceramic coating, or by way of a high temperature treatment specifically performed for this purpose.

Finally, the ceramic coating is deposited by EBPVD under the particular process conditions of this invention. In accordance with known EBPVD processes, the ceramic coating is deposited from a vapor formed by melting and vaporizing a ceramic ingot with an electron beam generated by an electron beam (EB) gun of a type known in the art. Any number of ceramic ingots and EB guns can be used. A preferred ceramic coating material is zirconia ($ZrO_2$) partially or fully stabilized by yttria (preferably 2%–12% $Y_2O_3$), though zirconia stabilized with magnesia, ceria, calcia, scandia or other oxides could be used. The blades are preferably secured to a rotatable support of a type known in the art, and the ingot is located within the coating chamber such that its upper end is adjacent the blades. The electron beam is directed toward the upper end of the ingot, which causes the surface of the ingot to melt and form a molten pool of the ceramic material. Intense heating of the ceramic material by the electron beam causes molecules of the ceramic material to evaporate, travel upwardly, and then deposit on the surfaces of the blades. A stable blade deposition temperature of about 925° C. to about 1140° C. promotes the desired columnar grain structure for the ceramic layer, in which the longitudinal axis of each grain is roughly perpendicular to the blade surface.

In the prior art, a vacuum of at most 0.010 mbar, and more typically about 0.005 mbar, would be drawn within the coating chamber to perform the coating process, the reason being that higher pressures were known to cause erratic operation of the electron beam guns and make the electron beams difficult to control, with the presumption that inferior coatings would result. However, according to copending U.S. patent application Ser. No. 09/108,201 to Rigney et al., a preferred coating pressure is at least 0.010 mbar in order to produce a ceramic coating with improved spallation and impact resistance. Furthermore, prior art practice was to perform the coating process by flowing a mixture of oxygen and an inert gas (e.g., argon) into the coating chamber to maintain an oxygen partial pressure of at most 50%. However, according to this invention, flowing sufficient oxygen into the coating chamber to achieve an oxygen partial pressure above 50% (e.g., above 0.005 mbar for a total chamber pressure of 0.010 mbar), and as high as 100%, has been determined to significantly reduce the density and thermal conductivity of the resulting ceramic coating. Furthermore, significantly faster deposition rates have also been observed with higher oxygen partial pressures. To obtain higher oxygen partial pressures, oxygen and an inert gas such as argon can be introduced separately or together into the coating chamber to achieve a mixture containing at least 50% oxygen, or oxygen alone can be flowed into the chamber.

During an investigation leading to the present invention, coating parameters of this invention and the prior art were evaluated with test specimens formed of Hastelloy X and HS188 superalloys. The specimens had dimensions of about 25×100×1.5 $mm^3$, and before coating were cleaned by grit blasting, yielding a surface roughness of about 60 $\mu$inch (about 1.5 $\mu$m) Ra. Bulk density measurements were then performed by weighing the specimens and taking numerous dimensional measurements, after which the specimens were coated with 7% YSZ by EBPVD using the following parameters: a coating temperature of about 1000° C., a total coating pressure of about 0.012 mbar, and an oxygen partial pressure (PO2) of either 50% or 100%. Deposition within the 50% PO2 atmosphere was accompanied by the separate injection of oxygen and argon gases to yield an atmosphere of about 50% oxygen, compared to about 100% oxygen for deposition performed in the 100% PO2 atmosphere. For all specimens, coating was performed until a coating thickness of about 5 mils (about 125 micrometers) was obtained.

After coating, the deposited YSZ coatings were polished back slightly to remove high spots and produce a surface roughness of less than 30 $\mu$inch (about 0.8 $\mu$m) Ra. Bulk density measurements were then repeated by weighing and measuring the coated specimens. The results of the investigation are summarized below in Table I, which also reports relative densities for the coatings. Relative density is reported as a percentage of the theoretical full (100%) density value of 6.05 $g/cm^3$ for 7% YSZ containing incidental impurities.

TABLE I

| $PO_2$ (%) | Density ($g/cm^3$) | Rel. Density (%) | Thickness ($\mu$m) |
|---|---|---|---|
| 50% | 4.60–4.85 | 76–80% | 134–145 |
| 100% | 3.73–3.80 | 62–63% | 177–183 |

From the above results, it can be seen that the use of oxygen partial pressures (PO2) of 100% resulted in significantly lower coating densities than produced at oxygen partial pressures of 50%. The average difference in density was about 20%, suggesting that thermal conductivities of the coatings would also be at least 20% lower on average based on the following equation:

$$k = \alpha \rho C_p$$

where k is thermal conductivity (W/m/K), $\alpha$ is thermal diffusivity (cm$^2$/s), $\rho$ is density (g/cm$^3$), and $C_p$ is specific heat (W·s/g/K). Such reductions in density and thermal conductivity were considered to be very significant in terms of the desired thermal properties of the YSZ coatings.

Also based on the above results, it was apparent that greater coating thicknesses were achieved for the 100% PO2 specimens than the 50% PO2 specimens, though both were coated for the same length of time. On average, the 100% PO2 specimens had coating thicknesses of 30% greater than the 50% PO2 specimens, evidencing significantly improved process efficiency.

While our invention has been described in terms of a preferred embodiment, it is apparent that other forms could be adopted by one skilled in the art. For example, similar results are believed to be obtainable if the average oxygen partial pressure is maintained above 50%, though the actual partial pressure occasionally drops below this limit during the coating process, as would be the case if the oxygen flow rate into the coating chamber is intentionally cycled to periodically yield oxygen partial pressures above and below 50%. Accordingly, the scope of our invention is to be limited only by the following claims.

What is claimed is:

1. A method for forming a ceramic layer on a component by electron beam physical vapor deposition, the method comprising the steps of:
    forming an alumina scale forming bond coat on a surface of the component;
    forming an alumina scale from a surface of the bond coat; and then
    depositing a ceramic material directly on the alumina scale by evaporating a ceramic material with an electron beam while the component is within a coating chamber at an absolute pressure of greater than 0.010 mbar and having
    an average oxygen partial pressure of greater than 50% of the absolute pressure, the ceramic material being evaporated with the electron beam to produce a vapor of the ceramic material, the vapor depositing on the alumina scale to form a layer of the ceramic material.

2. A method as recited in claim 1, wherein the partial pressure of oxygen within the coating chamber is at least 0.012 mbar.

3. A method as recited in claim 1, wherein the partial pressure of oxygen within the coating chamber is about 100% of the absolute pressure.

4. A method as recited in claim 1, further comprising the step of flowing oxygen and at least a second gas into the coating chamber during the evaporating step to maintain the absolute pressure of greater than 0.010 mbar and the average oxygen partial pressure of greater than 50% of the absolute pressure.

5. A method as recited in claim 1, further comprising the step of flowing only oxygen into the coating chamber during the evaporating step.

6. A method as recited in claim 1, wherein the layer of the ceramic material has a relative density of less than 76% of theoretical immediately following deposition on the surface of the component.

7. A method as recited in claim 1, wherein the ceramic material is yttria-stabilized zirconia.

8. A method as recited in claim 1, wherein the component is an airfoil.

9. A method for forming a ceramic layer on a component by electron beam physical vapor deposition, the method comprising the steps of:
    forming a bond coat on a surface of the component;
    forming an alumina scale on a surface of the bond coat; and then
    depositing a ceramic material directly on the alumina scale by evaporating a ceramic material with an electron beam while the component is within a coating chamber at an absolute pressure of greater than 0.010 mbar and having an average oxygen partial pressure of greater than 50% of the absolute pressure, the ceramic material being evaporated with the electron beam to produce a vapor of the ceramic material, the vapor depositing on the alumina scale to form a layer of the ceramic material;
    wherein the ceramic material is zirconia stabilized by about 7 weight percent yttria, and the layer of the ceramic material has a density of less than 4.6 g/cm$^3$ immediately following deposition on the surface of the component.

* * * * *